United States Patent
Jinno

(10) Patent No.: US 8,003,978 B2
(45) Date of Patent: Aug. 23, 2011

(54) ORGANIC ELECTROLUMINESCENT DISPLAY DEVICE

(75) Inventor: Yushi Jinno, Gifu (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 1323 days.

(21) Appl. No.: 11/526,238

(22) Filed: Sep. 25, 2006

(65) Prior Publication Data

US 2007/0069205 A1 Mar. 29, 2007

(30) Foreign Application Priority Data

Sep. 26, 2005 (JP) ................................. 2005-277300
Mar. 29, 2006 (JP) ................................. 2006-091900

(51) Int. Cl.
*H01L 35/24* (2006.01)
*H01L 51/00* (2006.01)
(52) U.S. Cl. .............................. 257/40; 257/59; 257/72
(58) Field of Classification Search .................... 257/40, 257/59, 72
See application file for complete search history.

(56) References Cited

U.S. PATENT DOCUMENTS

| | | | | |
|---|---|---|---|---|
| 5,673,955 A | * | 10/1997 | Neubauer | ................. 294/31.1 |
| 6,621,103 B2 | | 9/2003 | Yamada | |
| 6,812,912 B2 | | 11/2004 | Mlyajima et al. | |
| 2002/0038998 A1 | * | 4/2002 | Fujita et al. | ................. 313/495 |
| 2002/0063261 A1 | * | 5/2002 | Zhang | ................. 257/178 |
| 2002/0140343 A1 | * | 10/2002 | Hirabayashi | ................. 313/493 |
| 2003/0147018 A1 | | 8/2003 | Sano et al. | |
| 2004/0041518 A1 | | 3/2004 | Yoneda | |
| 2005/0088369 A1 | * | 4/2005 | Yoshioka | ................. 345/60 |

FOREIGN PATENT DOCUMENTS

JP 2004-134356 4/2004

* cited by examiner

*Primary Examiner* — Eugene Lee
*Assistant Examiner* — Anthony Ho
(74) *Attorney, Agent, or Firm* — Morrison & Foerster LLP

(57) ABSTRACT

The invention prevents a photocurrent due to external light and a variation in characteristics of transistors or a failure by a short circuit due to the influence of a back channel. A light shield film made of a nonconductive material is formed on an insulation substrate. A back gate insulation film is formed covering the light shield film. An active layer is formed on this back gate insulation film. A gate insulation film is formed covering the active layer, and a gate electrode is formed on the gate insulation film. The light shield film is disposed covering the active layer with the back gate insulation film interposed therebetween, having a function of shielding the active layer from external light entering through the insulation substrate.

7 Claims, 4 Drawing Sheets

⇧ External Light

ORGANIC ELECTROLUMINESCENT DISPLAY DEVICE

CROSS-REFERENCE OF THE INVENTION

This application claims priority from Japanese Patent Applications Nos. 2005-277300 and 2006-091900, the contents of which are incorporated herein by reference in their entirety.

BACKGROUND OF THE INVENTION

1. Field of the Invention

The invention relates to an organic electroluminescent display device having a thin film transistor in each of pixels.

2. Description of the Related Art

An organic electroluminescent (referred to as "EL", hereafter) display device using an organic EL element as a self-emissive element has been developed as a display device replacing a CRT or an LCD in recent years. Particularly, an active matrix type organic EL display device that has a thin film transistor (referred to as "TFT", hereafter) driving an organic EL element in response to a video signal in each of the pixels has been developed.

The TFT is formed on a glass substrate. Therefore, in a bottom emission type organic EL display device where light from the organic EL element is emitted through this glass substrate, external light enters an active layer of the TFT through the glass substrate. This external light excites carriers in the active layer if it is strong, and a photocurrent (off-state leak current) flows between a source and a drain to cause a crosstalk or the like, thereby degrading display contrast.

A technology where a photocurrent is prevented by providing a light shield film shielding an active layer of TFT from external light is known as described in Japanese Patent Application Publication No. 2004-134356.

However, when the light shield film is made of a conductive material, there is such a problem caused by a back channel that a variation in characteristics (e.g. a threshold value) of the TFTs or a display failure by a short circuit between the light shield film and the active layer occurs.

SUMMARY OF THE INVENTION

The invention provides an organic electroluminescent display device including: an organic electroluminescent element formed on an insulation substrate and emitting light through the insulation substrate; and a thin film transistor driving the organic electroluminescent element, the thin film transistor including: a semiconductor layer formed on the insulation substrate; a light shield film made of a nonconductive material formed on the insulation substrate and shielding the semiconductor layer from external light entering through the insulation substrate; a back gate insulation film interposed between the light shield film and the semiconductor layer; a gate insulation film formed covering a channel region of the semiconductor layer; and a gate electrode formed on the gate insulation film.

DETAILED DESCRIPTION OF THE INVENTION

Figure 1:
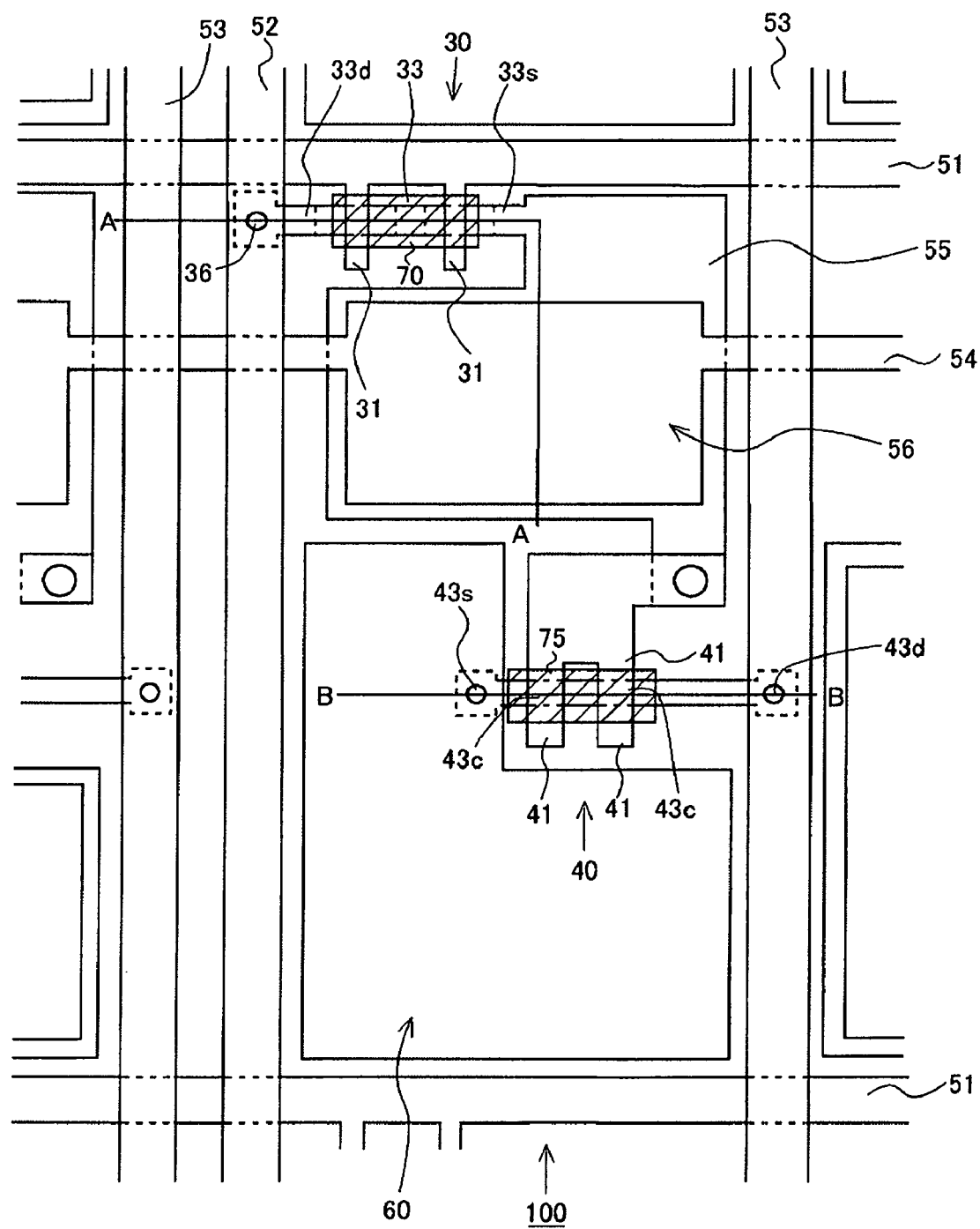
FIG. 1 is a plan view of a pixel of an organic EL display device of a first embodiment of the invention.
Figure 2A:
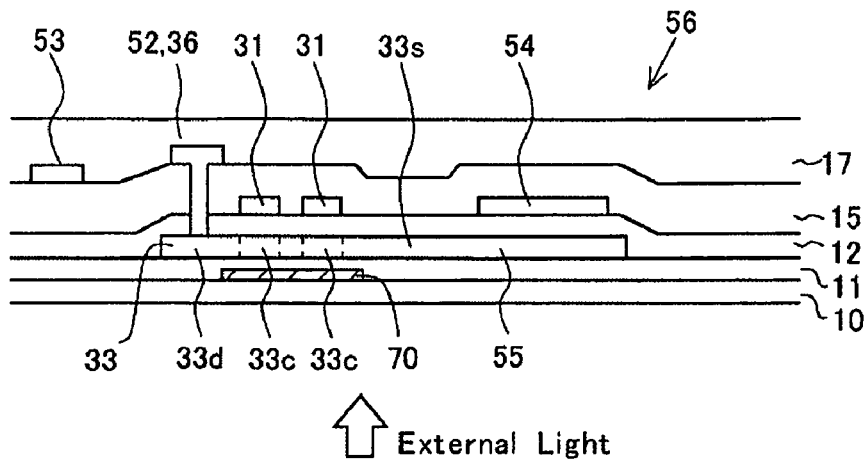
FIGS. 2A and 2B are cross-sectional views of the pixel of the organic EL display device of the first embodiment of the invention.
Figure 2B:
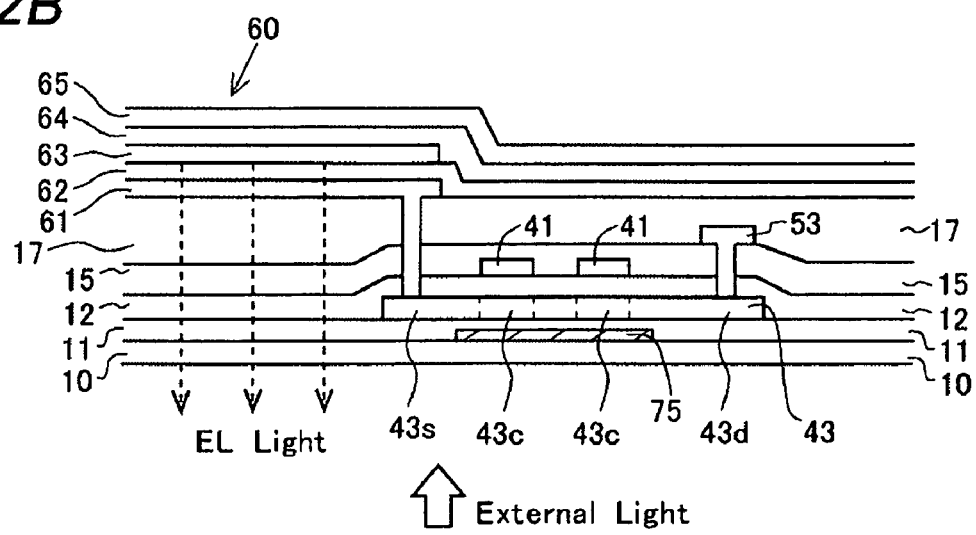

A structure of a pixel of an organic EL display device of a first embodiment of the invention will be described. FIG. 1 shows a plan view of the pixel of the organic EL display device, FIG. 2A shows a cross-sectional view of FIG. 1 along line A-A, and FIG. 2B shows a cross-sectional view of FIG. 1 along line B-B.

A pixel 100 is formed corresponding to an intersection of a gate signal line 51 and a drain signal line 52 as shown in FIG. 1, and the pixels 100 are arrayed in a matrix. An organic EL element 60, a pixel selection TFT 30 controlling timing of supplying an electric current to this organic EL element 60, a driving TFT 40 supplying an electric current to the organic EL element 60, and a storage capacitor 56 are disposed in the pixel 100.

A source 33s of the pixel selection TFT 30 also serves as a capacitor electrode 55 forming a capacitor with a storage capacitor electrode line 54, and is connected to a gate electrode 41 of the driving TFT 40. A source 43s of the driving TFT 40 is connected to an anode layer 61 of the organic EL element 60, and a drain 43d on the other side is connected to a drive power supply line 53 as a power supply supplying power to the organic EL element 60.

The storage capacitor electrode line 54 is disposed parallel with the gate signal line 51. The storage capacitor electrode line 54 is made of chromium or the like, and forms a capacitor accumulating electric charge with a capacitor electrode 55 connected to the source 33s of the TFT 30 with a gate insulation film 12 interposed therebetween. This storage capacitor 56 is provided for holding a voltage applied to the gate electrode 41 of the driving TFT 40.

Next, the pixel selection TFT 30 will be described referring to FIG. 2. A light shield film 70 made of a nonconductive material is formed on an insulation substrate 10 made of quartz glass, non-alkali glass, or the like. Amorphous silicon (referred to as "a-Si", hereafter) is preferable as the nonconductive material, but epoxy resin containing silicon nitride ($SiN_X$) or a pigment of black or the like can be also used. The light shield film 70 made of a-Si is formed by depositing an a-Si film by a CVD method or the like and patterning this. Then, a back gate insulation film 11 made of a single layer of a $SiO_2$ film or a $SiN_X$ film or a layered film of these is formed covering the light shield film 70.

An a-Si film is deposited on this back gate insulation film 11 by a CVD method or the like again. The a-Si film is irradiated with laser beams, and melted and recrystallized, forming a polysilicon film (referred to as a "p-Si film", hereafter) as an active layer 33. A single layer of a $SiO_2$ film or a $SiN_X$ film or a layered film of these is formed on the active layer 33 as the gate insulation film 12, and a gate electrode 31 made of metal having a high melting point such as Cr or Mo is formed on the gate insulation film 12. The active layer 33 below the gate electrode 31 serves as a channel region 33c.

Figure 3:
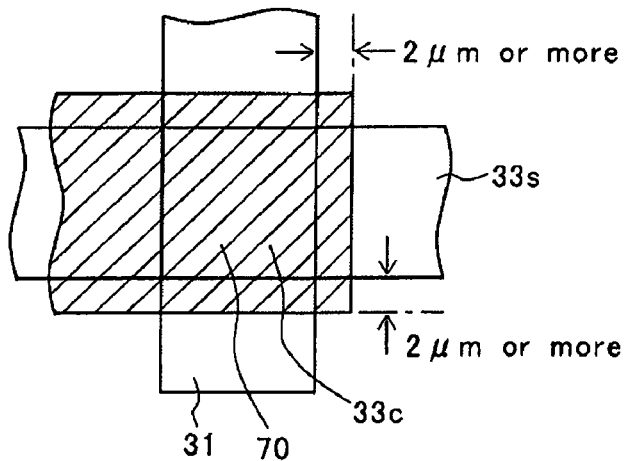
FIG. 3 is an enlarged plan view of a pixel selection TFT of FIG. 1.

The light shield film 70 is disposed covering the active layer 33 over the back gate insulation film 11, and has a function of shielding the active layer 33 from external light entering through the insulation substrate 10. Since a photocurrent due to external light often occurs in the end of the channel region 33c of the TFT, it is preferable to form the light shield film 70 extending over the end of the channel region 33c by 2 µm or more as shown in FIG. 3 for enhancing the light shielding effect.

Furthermore, the thickness of the light shield film 70 is preferably from 250 Å to 600 Å when it is made of a-Si. Setting the thickness 250 Å or more is for securing a light shield rate, and setting the thickness 600 Å or less is for preventing a large heat capacity that causes a low speed of cooling the active layer 33 after irradiated with lasers, that results in reduction of the grain size of the active layer 33 and the carrier mobility of the TFT 30. Furthermore, setting the thickness 600 Å or less is advantageous, because if the thickness is larger than this, the coverage of the back gate insulation film is degraded. That is, the melting and re-crystallization of the active layer during its crystallization by laser irradiation makes the thickness uneven, thereby easily causing failures such as disconnection or the like due to the step of the light shield film.

An interlayer insulation film 15 made of a $SiO_2$ film, a SiN film, and a $SiO_2$ film layered in this order is formed on the whole surfaces of the gate insulation film 12 and the active layer 33. A drain electrode 36 (drain signal line 52) is provided in the interlayer insulation film 15 by filling a contact hole provided corresponding to the drain 33d with metal such as Al. The drive power supply line 53 is formed on the interlayer insulation film 15. A planarization insulation film 17 made of organic resin is formed thereon for planarizing the surface.

Next, the driving TFT 40 will be described referring to FIG. 2B. An active layer 43 made by poly-crystallizing an a-Si film by laser irradiation, the gate insulation film 12, and the gate electrode 41 made of metal having a high melting point such as Cr or Mo are formed on the insulation substrate 10 in this order. The active layer 43 is provided with a channel region 43c, and the source 43s and the drain 43d on each side of the channel region 43c. The interlayer insulation film 15 is formed on the whole surfaces of the gate insulation film 12 and the active layer 43. The drive power supply line 53 connected to the drive power supply by filling a contact hole provided corresponding to the drain 43d with metal such as Al is formed there. The first planarization insulation film 17 is further formed on the whole surface. A contact hole is formed in a position corresponding to the source 43s in the planarization insulation film 17. A transparent electrode made of ITO and contacting to the source 43s through the contact hole, i.e., an anode layer 61 of the organic EL element is provided on the planarization insulation film 17. The anode layer 61 is formed in each of the pixels, being isolated as an island.

The organic EL element 60 has a structure laminated with the anode layer 61 made of a transparent electrode such as ITO (Indium Tin Oxide), a hole transport layer 62 made of a first hole transport layer made of MTDATA (4,4-bis (3-methylphenylphenylamino) biphenyl) and a second hole transport layer made of TPD (4,4,4-tris (3-methylphenylphenylamino) triphenylanine), an emissive layer 63 made of $Bebq_2$ (bis(10-hydroxybenzo[h]quinolinato)beryllium) containing a quinacridone derivative, an electron transport layer 64 made of $Bebq_2$, and a cathode layer 65 made of magnesium-indium alloy, aluminum, or aluminum alloy, in this order. In the organic EL element 60, holes injected from the anode layer 61 and electrons injected from the cathode layer 65 are recombined in the emissive layer and excitons are generated by exciting organic molecules forming the emissive layer. Light is emitted from the emissive layer in a process of radiation of the excitons and then released outside after going through the transparent anode layer 61 to the insulation substrate 10, thereby completing light-emission.

A light shield film 75 is also provided for the driving TFT 40, as shown in FIG. 1 and FIG. 2B.

A second embodiment is described hereinafter.

Figure 6:
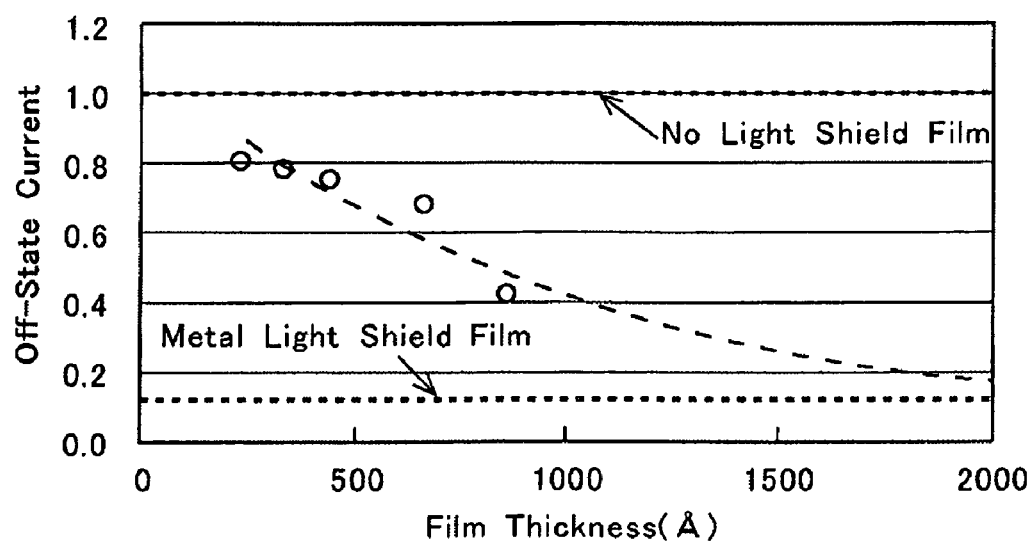
FIG. 6 is a graph showing a relation of a thickness of a light shield film and an off-state current occurring when external light enters an active layer of a TFT.

FIG. 6 shows a result of measuring an amount of a photocurrent occurring when the TFT is irradiated with 90000 lx of light. The amount of the photocurrent is shown by a relative value based on an amount of a photocurrent occurring when no light shield film is provided that is supposed to be 1.0. As apparent from the figure, although the light shield film has the light shielding effect even when its thickness is about 200 Å, the light shielding performance is enhanced when the thickness is about 400 Å or more and the performance becomes equivalent to that of a metal film when the thickness is about 600 Å or more. There is thus a case where the thick light shield film is necessary even when it is made of a nonconductive film. However, a problem may occur in the coverage of the active layer as described above.

Figure 4:
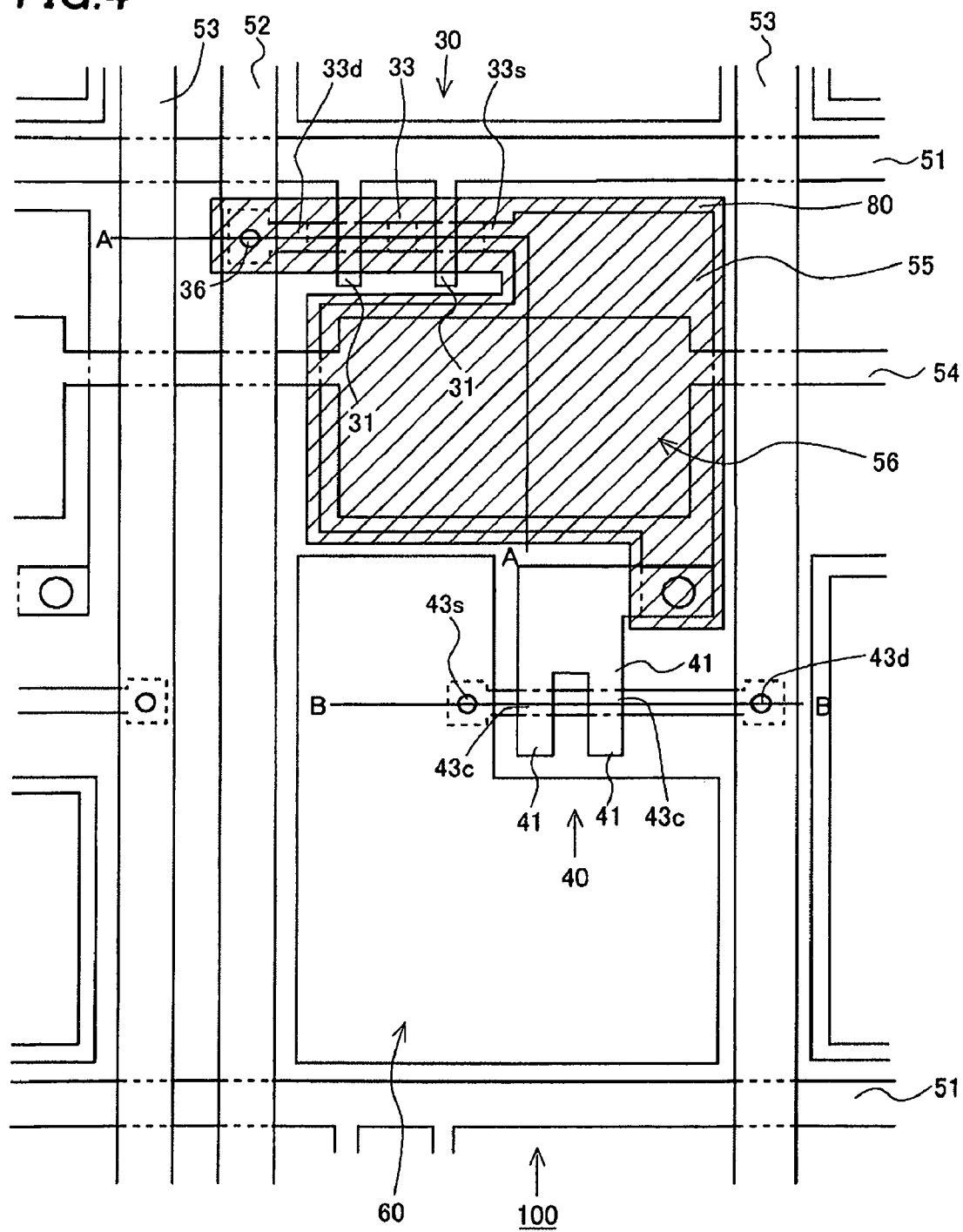
FIG. 4 is a plan view of a pixel of an organic EL display device of a second embodiment of the invention.
Figure 5:
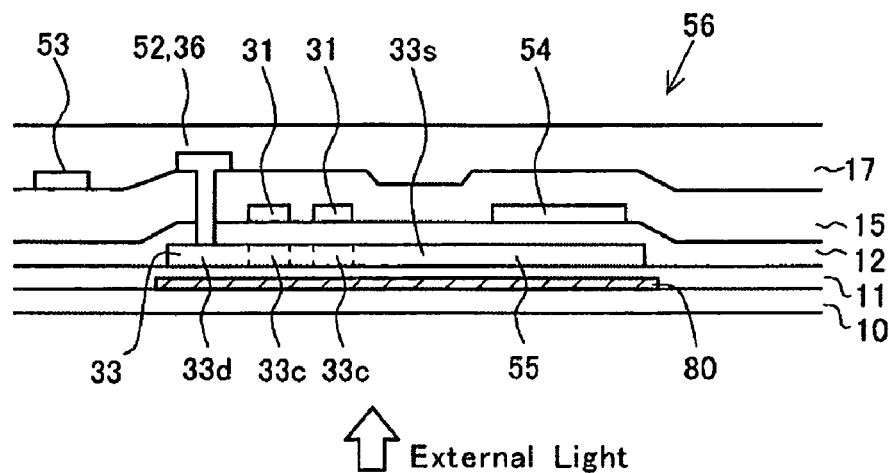
FIG. 5 is a cross-sectional view of the pixel of the organic EL display device of the second embodiment of the invention.

In the second embodiment, for solving this, the whole surfaces of the active layer 33 and the capacitor electrode 55 continuing therefrom are covered by the light shield film. That is, the whole polysilicon film where the active layer is integrally formed is covered by the light shield film. FIG. 4 shows a plan view and FIG. 5 shows a cross-sectional view of FIG. 4 along line A-A. The reference numerals are the same as those in the first embodiment except the light shield film 80 that is larger than the light shield film 70 of the first embodiment. Shielding in this manner prevents a problem of degrading the coverage of the polysilicon film, and thus the light shield film can be formed thicker than in the first embodiment, so that the light shield film having the enhanced light shielding performance can be obtained. In this embodiment, it is preferable to form the light shield film with the thickness from 400 Å to 2000 Å, taking account of the light shielding performance, easiness of film deposition, and step coverage.

In this embodiment, the semiconductor layer forming the pixel selection TFT and the semiconductor layer forming the storage capacitor are integrally formed, and the light shield film is provided so as to shield the whole surface of this integrated semiconductor layer from light. However, when these are separated like islands and connected through wirings or the like or when there is a driving TFT or a TFT for other purposes as well as the pixel selection TFT, the light shield film can be provided for each of the elements. The TFT used for other purposes is TFT disposed in a pixel and used for operating an EL element.

In the organic electroluminescent display device of the embodiments above, since the light shield film made of a nonconductive material shielding the semiconductor layer of the thin film transistor from external light is provided, a photocurrent due to the external light can be prevented and a variation in characteristics of the transistors or a failure by a short circuit due to the influence of a back channel can be prevented. This prevents a display failure.

What is claimed is:

1. An organic electroluminescent display device comprising:
    an insulating substrate;
    an organic electroluminescent element formed on the substrate and configured to emit light through the substrate;
    a thin film transistor selecting the organic electroluminescent element and comprising a semiconductor layer disposed on the substrate, a back gate insulation film disposed between the substrate and the semiconductor layer, a gate insulation film disposed on the semiconductor layer and a gate electrode disposed on the gate insulation film; and a light shield film made of a nonconductive material so as not to be electrically conductive, disposed between the substrate and the back gate insulation film, and configured to shield the semiconductor layer from external light passing through the substrate, wherein the nonconductive material comprises amorphous silicon.

2. The organic electroluminescent display device of claim 1, wherein a thickness of the light shield film is from 250 Å to 600 Å.

3. The organic electroluminescent display device of claim 1, wherein the light shield film covers an area of the semiconductor layer corresponding to the thin film transistor.

4. The organic electroluminescent display device of claim 3, wherein a thickness of the light shield film is from 400 Å to 2000 Å.

5. The organic electroluminescent display device of claim 1, wherein part of the semiconductor layer is configured to operate as part of a storage capacitor, and the light shield film covers an area of the semiconductor layer corresponding to the storage capacitor.

6. The organic electroluminescent display device of claim 1, wherein the semiconductor layer comprises a channel region configured to operate as a channel, and an end of the light shield film exceeds a corresponding end of the channel region by 2 μm or more.

7. An organic electroluminescent display device comprising:

an insulating substrate;

an organic electroluminescent element formed on the substrate and configured to emit light through the substrate;

a thin film transistor selecting the organic electroluminescent element and comprising a semiconductor layer disposed on the substrate, a back gate insulation film disposed between the substrate and the semiconductor layer, a gate insulation film disposed on the semiconductor layer and a gate electrode disposed on the gate insulation film; and a light shield film made of a nonconductive material, disposed between the substrate and the back gate insulation film, and configured to shield the semiconductor layer from external light passing through the substrate, wherein the semiconductor layer comprises a channel region configured to operate as a channel, and an end of the light shield film exceeds a corresponding end of the channel region by 2 μm or more.

* * * * *